May 30, 1967 W. W. O'CONNOR 3,323,065

TRANSISTOR PROTECTION CIRCUIT FOR RADIO TRANSMITTER

Filed May 11, 1964 2 Sheets-Sheet 1

INVENTOR.
WILLIAM W. O'CONNOR
BY Mueller & Aichele
Attys.

INVENTOR.
WILLIAM W. O'CONNOR
BY
Mueller & Aichele
Attys.

United States Patent Office 3,323,065
Patented May 30, 1967

3,323,065
TRANSISTOR PROTECTION CIRCUIT FOR RADIO TRANSMITTER

William W. O'Connor, Chicago, Ill., assignor to Motorola, Inc., Franklin Park, Ill., a corporation of Illinois Filed May 11, 1964, Ser. No. 366,393
14 Claims. (Cl. 325—151)

This invention relates to circuits for the protection of transistors from damage caused by a variation in the load impedance and in particular to the protection of the output transistors of a carrier wave transmitter.

Many electronic devices having a variable impedance as, for example, transistors and other semiconductor devices used in the output circuits of carrier wave transmitters, are subject to damage or destruction by excessive current. The excessive current drawn by the load can also damage the power supply. Excessive current can be caused by a drop in the impedance the transistor presents to its power supply. The impedance of transistors can change during tuning and with changes in the load impedance coupled to the transistor. For example, the impedance of the antenna load of a final amplifier transistor of a carrier wave transmitter may change if the antenna is removed or strikes an object such as a tree or a bush. The changes in the impedance of the load of the transistor can cause the transistor impedance to decrease to a value which will result in the transistor drawing excessive current from the power supply. If the current through the transistor is sufficiently high, the transistor can be destroyed. The transistor can be protected from excessive current by reducing the supply voltage to the transistor to a value which limits the current supplied to the transistor to a safe value. If the impedance of the transistor falls below a predetermined level the transistor should be disconnected from the power supply to prevent damage, since an impedance below this predetermined level indicates a severe mismatch and high internal dissipation. In addition the drive signal amplitude to the transistor should be reduced as the supply voltage is reduced to prevent the driver from operating into a mismatched load. The output of the transistor amplifier should be maintained at as high a value as possible consistent with safe operation and the protective action should be automatic.

It is therefore an object of this invention to provide a transistor amplifier with a protective device which will limit the current supplied to the amplifier to a safe value and maintain the amplifier output at as a high level as possible.

Another object of this invention is to provide a transistor amplifier with a protective device which will decrease the drive signal amplitude to a transistor as the voltage supplied to the transistor is decreased.

Another object of this invention is to provide a transitor amplifier circuit with a protective device which will determine the impedance of the transistor amplifier and disconnect the power supply therefrom if the impedance falls below a predetermined value and reconnect the power supply when the amplifier impedance returns to a predetermined value.

A feature of this invention is the provision of a transistor amplifier stage with a current limiting device which reduces the supply voltage to the transistor amplifier when the impedance of the transistor amplifier decreases, thereby limiting the transistor current to a safe value.

Another feature of this invention is the provision of a transistor amplifier with a protective device which will reduce the amplitude of the drive signal to the transistor amplifier when the supply voltage thereto is reduced.

Another feature of this invention is the provision of a transistor amplifier with an impedance sensing device which will disconnect the transistor amplifier and its driver stages from the power supply if the impedance of the transistor amplifier falls below a predetermined level and reconnect the power supply to the transistor amplifier and its driver stages when the impedance of the transistor amplifier stage increases to a predetermined level.

In practicing this invention a transistor amplifier having a final amplifier stage and a plurality of driver amplifier stages is provided, and each of the driver and final amplifier stages is connected to a power supply through a current limiting transistor circuit. The current limiting transistor circuit senses the impedance of the amplifier to which it is connected to limit the current supplied to the amplifier to a safe value. One of the driver stages has its current limiter coupled to and responsive to the current limiter of the final amplifier to limit the current supplied to this driver stage when the current supplied to the final amplifier is limited. This reduces the drive signal amplitude to the final amplifier when its impedance falls below a predetermined level. A voltage regulating circuit is also coupled to the final amplifier. When the impedance of the final amplifier falls below a predetermined level the voltage regulating circuit acts to change the bias potential applied to the transistor current limiters causing them to disconnect the amplifiers, to which they are coupled, from the power supply. The amplifiers remain disconnected from the power supply until the impedance of the final amplifier increases to a value which is safe for operation of the final amplifier. At this point the transistor current limiters are biased by the voltage regulating circuit in such a manner that they again couple the power supply to the amplifiers. By limiting the current supplied to the load the power supply is also protected from damage.

Figure 1:
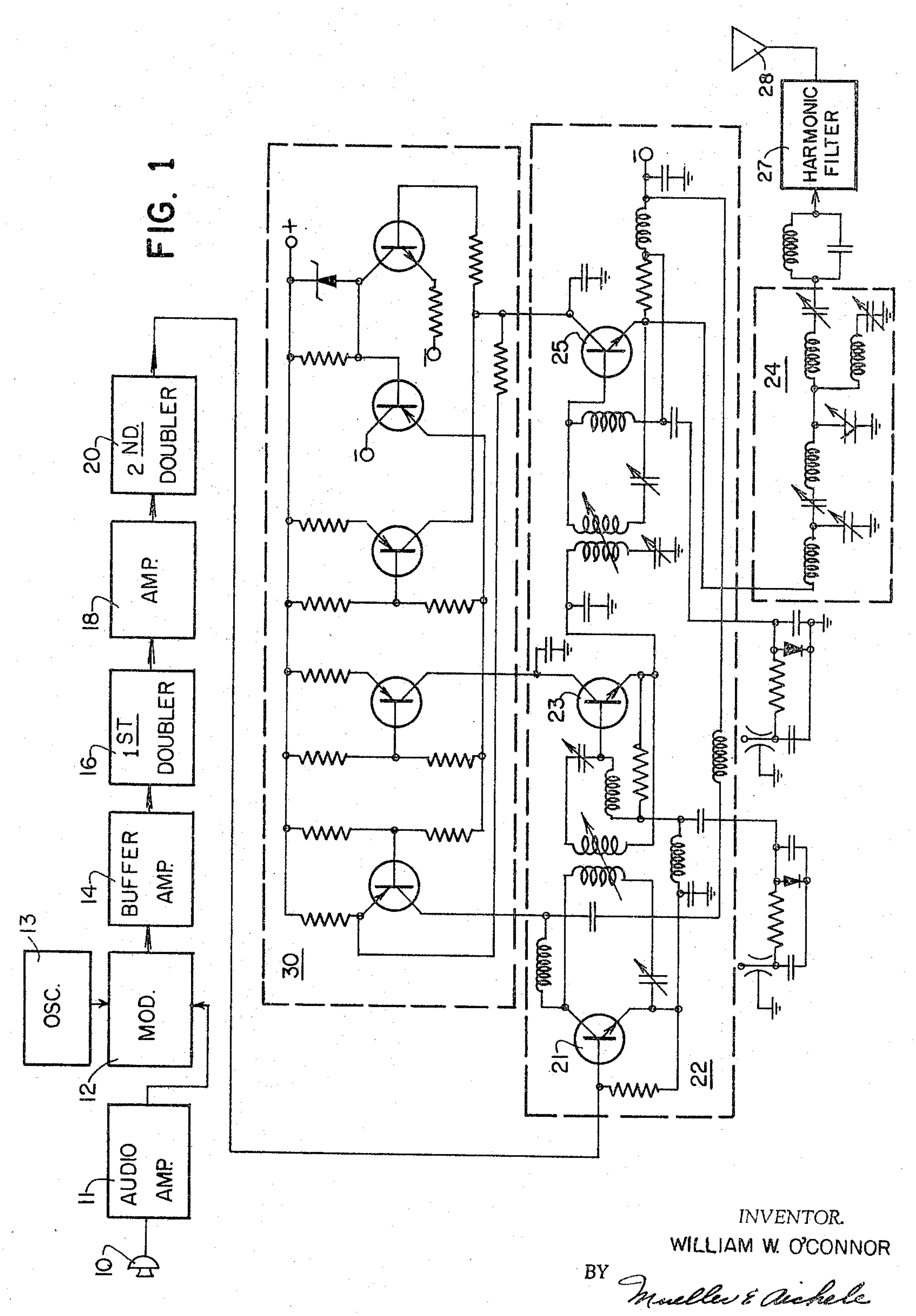
FIG. 1 is a partial block and partial schematic diagram of a carrier wave transmitter incorporating the features of the invention.

This invention is illustrated in FIG. 1 which is a partial schematic and partial block diagram of a circuit incorporating the transistor protection circuit of this invention. Voice signals are received by microphone 10 and amplified in audio amplifier 11. A carrier wave signal is generated by oscillator 13 and modulated in modulator 12 by the audio signal from audio amplifier 11. The modulated carrier wave signal from modulator 12 is amplified in buffer amplifier 14 and the frequency is doubled in first doubler 16. The output of first doubler 16 is amplified in amplifier 18 and the frequency is again doubled in second doubler 20.

The output of second doubler 20 is coupled to the amplifier stage 22 which consists of three radio frequency amplifier circuits including transistor amplifiers 21, 23 and 25. The modulated carrier wave signal from the second doubler 20 is amplified in first driver 21 and second driver 23. The amplified carrier wave signal is applied to transistor power amplifier 25 for further amplification. The output of transistor power amplifier 25 is coupled to antenna 28 through an output circuit including varactor multiplier 24 and harmonic filter 27. Amplifiers 21, 23 and 25 are coupled to the power supply through protection circuit 30.

Figure 2:
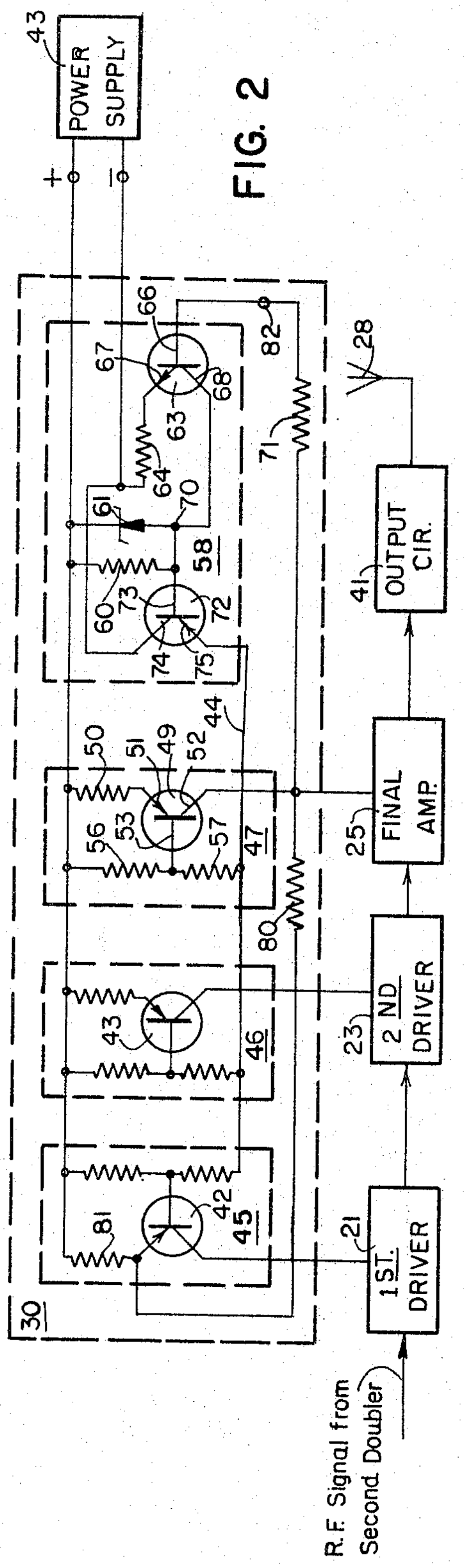
FIG. 2 is a partial block and partial schematic diagram of the protective circuit of this invention.

A simplified schematic and block diagram of the transistor amplifier stages 21, 23, 25 and transistor protection circuit 30 is shown in FIG. 2. Power supply 43 is coupled to the transistor amplifier circuits by means of transistor protection circuit 30. The positive terminal of power supply 43 is coupled to the individual driver amplifiers 21 and 23 and final amplifier 25 through current limiters 45, 46 and 47 respectively. Each of the current limiters acts in the same manner and only the operation of current limiter 47, coupling the positive terminal of power supply 43 to final amplifier 25, will be described in detail.

Current for final amplifier 25 flows from the positive terminal of power supply 43 through resistor 50 and the emitter 51, and collector 52 of transistor 49. The bias applied to base 53 of transistor 49 determines the resistance of transistor 49 to this flow of current. Base 53 has a bias potential applied thereto from a voltage divider consisting of resistors 56 and 57 coupled between the positive terminal of the power supply and a regulated voltage bus 44.

In normal operation, with final amplifier 25 presenting an impedance to the power supply sufficiently high so that it draws less than its maximum rated current, transistor 49 is biased fully on by the voltage difference existing between base 53 and emitter 51. As the impedance of final amplifier 25 drops the current drawn by the final amplifier increases. This increase in current through the limiter circuit 47 produces a voltage drop across resistor 50 which causes the potential of emitter 51 to become more negative. The potential applied to base 53 remains constant as the voltage on regulated voltage bus 44 and the supply voltage remain constant. Thus the voltage difference between emitter 51 and base 53 decreases as the current through resistor 50 increases. As long as final amplifier 25 is drawing less than its rated current, the potential difference between emitter 51 and base 53 is sufficient to bias transistor 49 to saturation. However, when final amplifier 25 reaches its maximum current rating the voltage drop across resistance 50 is sufficiently high to bias transistor 49 into a region where its resistance to conduction increases. This increased resistance causes the voltage applied to final amplifier 25 to decrease. The decrease in voltage to final amplifier 25 causes the current drawn by the final amplifier to remain at a predetermined maximum level. Current limiter 47 is thus self limiting in this portion of its operating curve. Current limiters 45 and 46 couple the power supply to the driver amplifiers 21 and 23 respectively, and operate in the same manner as current limiter 47 to limit the current to their respective amplifiers.

The voltage regulator which supplies a regulated voltage to bus 44 is shown in circuit 58. Resistor 60 is connected in parallel with Zener diode 61 and this combination is connected in series with transistor 63 and resistor 64 between the positive and negative terminals of power supply 43. Base 66 of transistor 63 is coupled to the voltage supplied to final amplifier 25 through resistor 71. This biases base 66 of transistor 63 so that the transistor is fully conductive. As the voltage supplied to the final amplifier 25 by current limiter 47 is reduced the voltage applied to the base 66 of transistor 63 is also reduced and the conduction of transistor 63 is reduced. The action of Zener diode 61 is such that sufficient current flows through resistance 60 to develop a voltage drop at point 70 equal to the Zener voltage of Zener diode 61. Any excess current required by the voltage between the positive and negative terminals of the power supply flows through the Zener diode and from the Zener diode through the collector 68 and emitter 67 of transistor 63 and resistor 64 to the negative terminal of power supply 43. Point 70 is coupled to the voltage regulating bus 44 through emitter follower transistor 72. Collector 74 of transistor 72 is coupled to the negative supply terminal and emitter 75 of transistor 72 is coupled to regulated voltage bus 44. The voltage appearing at emitter 75 is substantially the same as the voltage appearing at the base 73 and thus the regulated voltage on bus 44 is substantially the same as the voltage at point 70.

In operation, as the voltage applied to final amplifier

25 is reduced, because the impedance of the final amplifier has dropped to a point where current limiting is required, the bias voltage supplied to base 66 of transistor 63 also drops causing this transistor to increase its resistance to the flow of current between the positive and negative terminals of the power supply. As the flow of current through transistor 63 decreases the flow of current through Zener diode 61 also decreases with the voltage at point 70 remaining constant. When a point is reached where the current through Zener diode 61 is zero, any further decrease in current must come from the current flowing through resistor 60 causing the voltage across this resistor to decrease and thus causing the voltage at point 70 and the voltage on the regulated bus 44 to increase. The increase in the voltage on bus 44 reduces the conduction of transistor 49 thus reducing the voltage applied to final amplifier 25 and to base 66 of transistor 63 further reducing the conduction of transistor 63. This regenerative action causes the voltage of bus 44 to become substantially equal to the positive supply voltage. The change in voltage of bus 44 biases transistors 49, 42 and 43 to cut off causing them to disconnect the first driver amplifier 21, the second driver amplifier 23 and final amplifier 25 from power supply 43. Thus if the final amplifier impedance is reduced to a value too low for safe operation, power supply 43 is disconnected from final amplifier 25 and from the driver amplifiers 21 and 23.

The power supply will remain disconnected from driver amplifier 21 and 23 and final amplifier 25 until the impedance of final amplifier 25 has risen to a value sufficient for safe operation of the circuit. Since transistor 49 is completely cut off, this transistor and the voltage regulator transistor 63 together with Zener diodes 61 and 60 are unable to sense the impedance of final amplifier 25. Thus it is necessary to provide other means to sense this impedance when final amplifier 25 is disconnected from power supply 43. The positive terminal of power supply 43 is connected to final amplifier 25 through resistors 80 and 81. The flow of current through these resistors, when final amplifier 25 is disconnected from power supply 43, establishes a bias voltage at point 82. The resistance of resistors 80 and 81 is sufficiently high so that they do not affect the voltage supply to final amplifier 25, when current limiter 47 is in operation.

When the voltage at point 82 reaches a sufficiently high value transistor 63 is biased to partial conduction and current flows through resistance 60, transistor 63 and resistance 64 to the negative terminal of power supply 43. This decreases the voltage at point 70 and also the voltage on the regulated bus 44. As the impedance of final amplifier 25 increases, point 82 increases to a point where transistor 63 is biased so that the voltage developed on regulated bus 44 is sufficiently high to cause conduction of current limiters 41, 46 and 47. This again increases the voltage applied to final amplifier 25 causing transistor 63 to be biased fully on by the regenerative action of the circuit. Thus driver amplifiers 21 and 23 and final amplifier 25 are reconnected to power supply 43 when the impedance of final amplifier 25 is sufficiently high for safe operation of the circuit.

When the voltage applied to final amplifier 25 is reduced it is also necessary that the amplitude of the drive signal to the final amplifier be reduced to prevent damage to the transistor of the driver amplifier. When limiter 47 acts to reduce the voltage applied to final amplifier 25 the reduction in voltage causes an increasing portion of the current required by final amplifier 25 to be obtained through resistances 80 and 81. The increase in current flowing through resistance 81, caused by the reduction in voltage applied to amplifier 25, biases transistor 42 toward non-conduction and reduces the voltage applied to driver 21 even though the current required by driver 21 is less than its rated value. This reduction in voltage to first driver 21 reduces the amplitude of the drive signal developed by driver 21 and thus the amplitude of the drive signal applied to amplifier 25.

Figure 3:
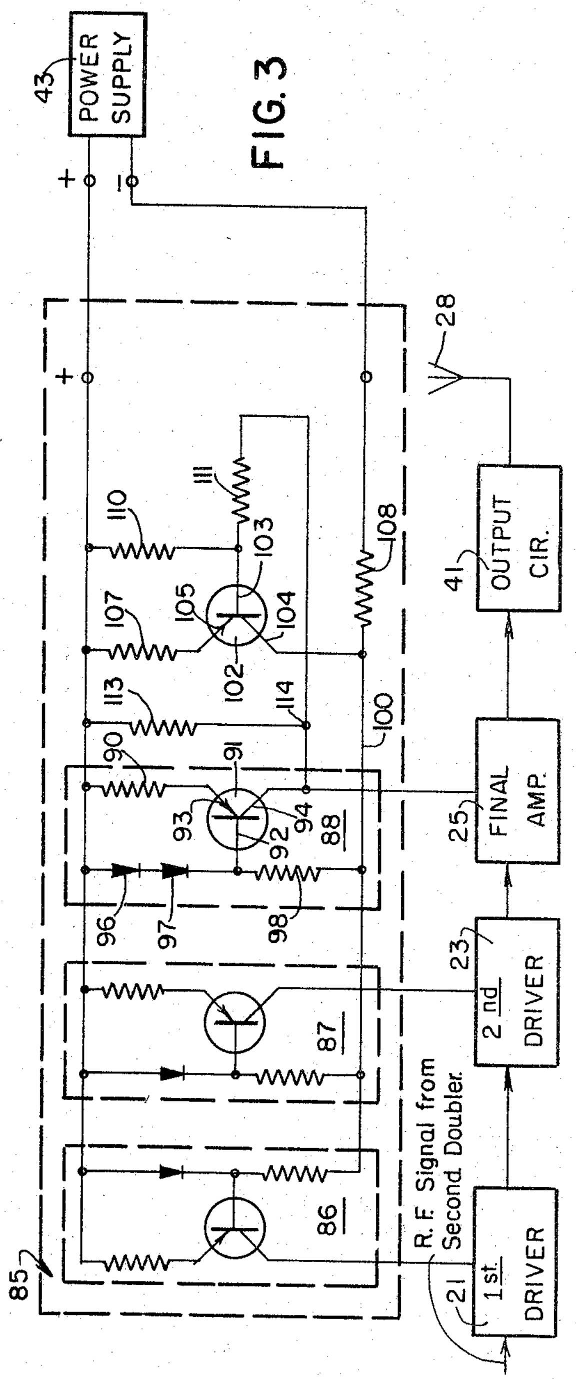
FIG. 3 is a partial block and partial schematic diagram of another embodiment of the protective circuit.

A second embodiment of the transistor protection circuit is shown in FIG. 3. The first driver 21 receives a signal from the second doubler and amplifies it and couples it to the second driver 23 and from there to the final amplifier 25. The final amplifier 25 is coupled to antenna 28 through output circuit 41. A power supply 43 is coupled to the amplifier circuits by means of transistor protection circuit 85. Current limiter 86 couples the power supply 43 to first driver 21, current limiter 87 couples the power supply 43 to second driver 23 and current limiter 88 couples power supply 43 to amplifier 25. The operation of current limiters 86, 87 and 88 is similar and the operation of current limiter 88 only will be explained in detail.

Power supply 43 is coupled to final amplifier 25 through resistor 90 and transistor 91. A bias potential for the base 92 of transistor 91 is provided by diodes 96 and 97 and resistor 98. The forward voltage drop across diodes 96 and 97 is sufficient to bias base 92 negative with respect to emitter 93 so that transistor 91 is biased fully on. Base 92 is coupled to a regulated voltage bus 100 through resistor 98 to provide a path for the bias current for diodes 96 and 97.

When the impedance of final amplifier 25 is reduced below a predetermined value the current flow through resistance 90 biases the emitter 93 of transistor 91 to the point where the resistance of emitter 91 to the flow of current through the transistor increases. This reduces the voltage applied to final amplifier 25 to limit the current supplied to the final amplifier. During this initial current limiting action the regulated bus 100 maintains a relatively constant voltage, therefore the bias applied to base 92 of transistor 91 remains relatively constant.

The voltage on regulated bus 100 is determined by the conduction through transistor 102. In normal operation, when final amplifier 25 is not drawing excessive current, the voltage across the base bias resistors 110 and 111 is substantially zero and the voltage applied to the base is approximately equal to the positive voltage from power supply 43. The emitter 105 is biased from the positive supply through resistor 107. Thus the base to emitter potential is substantially zero and transistor 102 is cut off. Since transistor 102 is cut off and the current drawn by regulated bus 100 is relatively small, the voltage drop across resistor 108 is small and therefore the voltage appearing on regulated bus 100 is substantially equal to the minus supply voltage of power supply 43.

When the impedance of final amplifier 25 is reduced to a point where it begins to draw excessive current and the limiting action of transistor 91 takes place, the voltage supplied to final amplifier 25 and base bias resistor 111 of transistor 102 decreases. This decrease in the voltage applied to resistor 111 and base 103 biases transistor 102 to partial conduction. The current flow through resistor 107, emitter 105, collector 104 and resistor 108 between the positive and negative terminals of power supply 43 causes the voltage applied to regulated bus 100 to increase. As long as the voltage appearing on regulated bus 100 is sufficiently negative with respect to the positive terminal power supply 43 to provide sufficient bias current through diodes 96 and 97 the voltage drop across these diodes remains relatively constant and thus the bias supply to base 92 of transistor 91 does not change. However, as the limiting action of transistor 91 increases the bias voltage applied to base 103 of transistor 102 decreases causing this transistor to be biased to greater conduction and the voltage on regulated bus 100 increases. A point is reached at which the voltage potential between the positive terminal of power supply 43 and regulated bus 100 is not sufficient to provide enough current to bias diodes 96 and 97 to a point where the voltage applied to base 92 of transistor 91 would remain constant. When this occurs the voltage at base 92 increases causing the conduction of transistor 91 to decrease. This decrease in conduction of transistor 91 caused by the voltage change on regulated bus 100 further reduces the voltage supplied to final amplifier 25. This regenerative action causes the voltage on regulated bus 100 to change to a point where transistor 91 is biased to non-conduction thereby disconnecting final amplifier 25 from power supply 43. The change in voltage of regulated bus 100 also acts to bias the current limiters 86 and 87 to non-conduction.

With current limiter 88 biased to cut off, the potential applied to final amplifier 25 is determined by the impedance of final amplifier 25 and the resistance of resistor 113. Thus the voltage appearing at point 114 is the measure of the impedance of final amplifier 25. Resistance 113 is sufficiently high so that it does not affect the potential of point 114 when current limiter 88 is biased to conduction. The potential at point 114 is applied to base 103 of transistor 102 through resistor 111. This potential determines the base bias of the transistor 102 and thus the conduction of this transistor when transistor 91 is biased to cut off. When the impedance of final amplifier 25 increases to a value sufficiently high for safe operation the potential of point 114 increases to a point where the bias potential applied to base 103 of transistor 102 biases this transistor to partial conduction. With transistor 102 biased to partial conduction the voltage applied to regulator line 100 decreases causing the bias potential applied to base 92 of transistor 91 to decrease. This biases transistor 91 to partial conduction further increasing the voltage at point 114. The increase in the potential at point 114 increases the bias at base 103 of transistor 102 causing this transistor to be biased to cut off, further increasing the voltage of regulated bus 100. The regenerative action of this circuit causes the bias on regulated bus 100 to change to a point where current limiters 86, 87 and 88 are biased to conduction and the limiters operate as described to limit the current to amplifiers 21, 23 and 25.

Thus a protection circuit for the transistor amplifiers of a carrier wave transmitter has been shown. The protection circuit operates automatically to limit the current drawn by a transistor amplifier to a safe value by reducing the supply voltage when the transistor impedance is reduced during tuning or when the load impedance changes. A large change in transistor impedance will cause the power supply to be disconnected from the amplifier. The reduction in supply voltage to the amplifier is accompanied by a reduction in the amplitude of the drive signal. While providing protection to the transistors the circuit also acts to maintain the power output of the transmitter at as high a level as possible consistent with safe operation.

I claim:

1. A transistor protection circuit for use in a carrier wave transmitter which includes a first portion for developing a carrier wave signal, a second portion for translating a carrier wave signal applied thereto, a carrier wave amplifier portion including final amplifier means having a variable impedance coupling the first portion to the second portion, and a power supply, said transistor protection circuit coupling the power supply to the carrier wave amplifier portion and including in combination, current limiting means coupling the power supply to the final amplifier means and being responsive to a reduction of the impedance thereof below a first predetermined value to reduce the power supply voltage applied thereto, whereby the current supplied by the power supply to the load is limited to an amount less than a predetermined value, voltage sensing means coupled to the final amplifier means and to said current limiting means, said voltage sensing means being responsive to a reduction of said applied voltage below a predetermined value to develop a control signal, said current limiting means being responsive to said control signal to disconnect the final amplifier means from the power supply, said voltage sensing means being responsive to an increase in the impedance of the final amplifier means above a predetermined value to reduce said control signal to render said current limiting means conducting to supply current to the final amplifier means from the power supply.

2. A transistor protection circuit for use in a carrier wave transmitter which includes a first portion for developing a carrier wave signal and a second portion for translating a carrier wave signal applied thereto, a carrier wave amplifier portion including final amplifier means having a variable impedance and at least one driver amplifier means coupling the first portion to the second portion, and a power supply, said transistor protection circuit coupling the power supply to the carrier wave amplifier portion and including in combination, first current limiting means coupling the power supply to the final amplifier means, and a separate second current limiting means coupling the power supply to each driver amplifier means, each of said first and second current limiting means being responsive to a reduction in the impedance of the amplifier means to which the respective current limiting means is coupled below a first predetermined value to reduce the power supply voltage applied to the amplifier means to which said respective current limiting means is coupled, whereby the current supply to each amplifier means is limited to an amount less than a predetermined value, voltage sensing means coupled to the final amplifier means and said first and second current limiting means, said voltage sensing means being responsive to a reduction of said voltage applied to the final amplifier means below a predetermined value to develop a control signal, said first and second current limiting means being responsive to said control signal to disconnect the final amplifier means and driver amplifier means from the power supply, said voltage sensing means being responsive to an increase in the impedance of the final amplifier means above a second predetermined value to reduce said control signal to render said first and second current limiting means conductive to supply current to the final amplifier means and driver amplifier means from the power supply.

3. A transistor protection circuit for use in a carrier wave transmitter which includes a first portion for developing a carrier wave signal and a second portion for translating a carrier wave signal applied thereto, a carrier wave amplifier portion including final amplifier means having a variable impedance and at least one driver amplifier means coupling the first portion to the second portion, and a power supply, said transistor protection circuit coupling the power supply to the carrier wave amplifier portion and including in combination, first current limiting means coupling the power supply to the final amplifier means, and a separate second current limiting means coupling the power supply to each driver amplifier means, each of said first and second current limiting means being responsive to a reduction in the impedance of the amplifier means to which the respective current limiting means is coupled below a first predetermined value to reduce the power supply voltage applied to the amplifier means to which said respective current limiting means is coupled, whereby the current supplied by the power supply to each amplifier means is limited to an amount less than a predetermined value, circuit means coupled to the final amplifier and one of said second current limiting means and responsive to said reduction in voltage applied to the final amplifier means to reduce the voltage applied to the driver amplifier means to which said one second current limiting means is coupled, whereby the drive signal to the final amplifier means is reduced, voltage sensing means coupled to the final amplifier means and said first and second current limiting means, said voltage sensing means being responsive to a reduction of said voltage applied to the final amplifier means below a predetermined value to develop a control signal, said first and second current limiting means being responsive to said control signal to disconnect the final amplifier means and driver amplifier means from the power supply, said voltage sensing means being responsive to an increase in the impedance of the final amplifier means above a second predetermined value to reduce said control signal to render said current limiting means conductive to supply current to the final amplifier means and driver amplifier means from the power supply.

4. A transistor protection circuit for use in a carrier wave transmitter which includes a first portion for developing a carrier wave signal and a second portion for translating a carrier wave signal applied thereto, a carrier wave amplifier portion including transistor final amplifier means having a variable impedance coupling the first portion to the second portion, and a power supply, said transistor protection circuit coupling the power supply to the final amplifier and including in combination, voltage regulator means coupled to the power supply to provide a first bias potential, current limiting transistor means coupled between the power supply and the final amplifier means, first circuit means coupling said voltage regulator means to said current limiting transistor means for applying said first bias potential thereto, said current limiting transistor means including bias means in series with the power supply and the final amplifier means, said current limiting transistor means being responsive to said bias means and with said first bias potential to reduce the supply voltage applied to the final amplifier means whereby the current supplied by the power supply to the final amplifier means is limited to a predetermined value, second circuit means coupling said voltage regulator means to the final amplifier means, said voltage regulator means being responsive to a decrease in said voltage applied to the final amplifier means below a predetermined value to generate a second bias potential, said current limiting transistor means being responsive to said second bias potential to disconnect the power supply from the final amplifier means, third circuit means coupling the power supply to the final amplifier means, said third circuit means being responsive to an increase in the impedance of the final amplifier means to a predetermined value to develop a control signal at the final amplifier means, said voltage regulator means being responsive to said control signal to generate said first bias potential whereby said current limiting transistor means is biased to reconnect the power supply to the final amplifier means.

5. A transistor protection circuit for use in a carrier wave transmitter which includes a first portion for developing a carrier wave signal and a second portion for translating a carrier wave signal applied thereto, a carrier wave amplifier portion including a transistor final amplifier having a variable impedance and a plurality of driver amplifiers coupling the first portion to the second portion, and a power supply, said transistor protection circuit coupling the power supply to the final amplifier and including in combination, voltage regulator means coupled to the power supply to provide a first bias potential, first transistor means coupled between the power supply and the final amplifier, a plurality of second transistor means each connecting a separate one of the plurality of driver amplifiers to the power supply, first circuit means coupling said voltage regulator means to said first and second transistor means for applying said first bias potential thereto, each of said first and second transistor means including a separate bias means in series with the power supply and the amplifier to which it is coupled, each of said first and second transistor means being responsive to said bias means and with said first bias potential to reduce the supply voltage applied to the amplifier to which it is coupled whereby the current supplied by the power supply to each amplifier is limited to a separate predetermined value, second circuit means coupling said voltage regulator means to the final amplifier, said voltage regulator means being responsive to a decrease in said voltage applied to the final amplifier below a predetermined value to generate a second bias potential, said first and second transistor means being responsive to said second bias potential to disconnect the power supply from the final amplifier and each of the driver amplifiers, third circuit means coupling the power supply to the final amplifier, said third circuit means being responsive to an increase in the impedance of the final amplifier to a predetermined value to develop a control signal at the final amplifier, said voltage regulator means being responsive to said control signal to generate said first bias potential whereby said first and second transistor means are biased to reconnect the power supply to the final amplifier and the plurality of driver amplifiers.

6. A transistor protection circuit for use in a carrier wave transmitter which includes a first portion for developing a carrier wave signal and a second portion for translating a carrier wave signal applied thereto, a carrier wave amplifier portion including a transistor final amplifier having a variable impedance and a plurality of driver amplifiers coupling the first portion to the second portion, a power supply, said transistor protection circuit coupling the power supply to the carrier wave amplifier portion and including in combination, voltage regulator means coupled to the power supply to provide a first bias potential, first transistor means coupled between the power supply and the final amplifier, a plurality of second transistor means each connecting a separate one of the plurality of driver amplifiers to the power supply, first circuit means coupling said voltage regulator means to said first and second transistor means for applying said first bias potential thereto, each of said first and second transistor means including a separate bias means in series with the power supply and the amplifier to which it is coupled, each of said first and second transistor means being responsive to said bias means and with said first bias potential to reduce the supply voltage applied to the amplifier to which it is coupled whereby the current supplied by the power supply to each amplifier is limited to a separate predetermined value, second circuit means coupling the bias means of one of the plurality of driver amplifiers to the final amplifier, said one bias means being responsive to a reduction in the voltage applied to the final amplifier to reduce the voltage applied to the driver amplifier to which said one bias means is coupled whereby the drive signal to the final amplifier is reduced, third circuit means coupling said voltage regulator means to the final amplifier, said voltage regulator means being responsive to a decrease in said voltage applied to the final amplifier below a predetermined value to generate a second bias potential, said first and second transistor means being responsive to said second bias potential to disconnect the power supply from the final amplifier and each of the driver amplifiers, fourth circuit means coupling the power supply to the final amplifier, said fourth circuit means being responsive to an increase in the impedance of the final amplifier to a predetermined value to develop a control signal at the final amplifier, said voltage regulator means being responsive to said control signal to generate said first bias potential whereby said first and second transistor means are biased to reconnect the power supply to the final amplifier and the plurality of driver amplifiers.

7. A transistor protection circuit for use in a carrier wave transmitter which includes a first portion for developing a carrier wave signal and a second portion for translating a carrier wave signal applied thereto, a carrier wave amplifier portion including a transistor final amplifier having a variable impedance coupling the first portion to the second portion, a power supply, said transistor protection circuit coupling the power supply to the final amplifier and including in combination, current limiting transistor means having base, emitter and collector electrodes, first bias resistance means coupled to said base electrode and to the power supply, second bias resistance means coupling said emitter electrode to the power supply, first circuit means coupling said collector electrode to the final amplifier, voltage regulator transistor means having a control electrode and an output electrode, regulating resistance means and Zener diode means connected in parallel, said parallel connected regulating resistance means and Zener diode means being series connected with said voltage regulating transistor means between the power supply and a reference potential, second circuit means coupling the final amplifier to said control electrode, third circuit means coupling the power supply to the final amplifier, and means coupling said first bias resistance means to said output electrode, said voltage regulator transistor means acting to control the flow of current through said parallel connected regulating resistance means and Zener diode means to establish a first bias potential at said output electrode, said current limiting transistor means being responsive to said first bias potential and said second bias resistor means to limit the current to the final amplifier to a predetermined value by reducing the voltage applied thereto, said voltage regulator transistor means being responsive to a decrease in said applied voltage below a predetermined value to establish a second bias potential at said control electrode, said current limiting transistor means being responsive to said second bias potential to be biased to a cut off condition whereby the final amplifier is disconnected from the power supply, said third circuit means being responsive to an increase in the impedance of the final amplifier to a predetermined value to develop a control voltage at said final amplifier, said voltage regulating transistor means being responsive to said control voltage to re-establish said first bias potential at said output electrode whereby said current limiting transistor means is biased to conduction to reconnect the final amplifier to the power supply.

8. A transistor protection circuit for use in a carrier wave transmitter which includes a first portion for developing a carrier wave signal and a second portion for translating a carrier wave signal applied thereto, a carrier wave amplifier portion coupling the first portion to the second portion and including a transistor final amplifier having a variable impedance, a first driver amplifier coupled to the final amplifier and a second driver amplifier coupled to the first driver amplifier, and a power supply, said transistor protection circuit coupling the power supply to the final amplifier and the first and second driver amplifiers and including in combination, first, second and third current limiting transistor means each having base, emitter and collector electrodes, each of said first, second and third current limiting transistor means having separate first bias resistor means coupled to said base electrodes and to the power supply and a separate second bias resistance means coupled between said emitter electrodes and the power supply, first, second and third circuit means coupling said collector electrodes of said first, second and third current limiting transistor means to the final amplifier, and the first and second driver amplifiers respectivley, voltage regulator transistor means having a control electrode and an output electrode, regulating resistance means and Zener diode means connected in parallel, said parallel connected regulating resistance means and Zener diode means being series connected with said voltage regulating transistor means between the power supply and a reference potential, fourth circuit means coupling the final amplifier to said control electrode, bias circuit means coupling said second bias resistor means and said emitter electrode of said third current limiting means to the final amplifier, and means coupling said first bias resistance means of said first, second and third current limiting means to said output electrode, said voltage regulator transistor means acting to control the flow of current through said parallel connected regulating resistance means and Zener diode means to establish a first bias potential at said output electrode, said first, second and third current limiting transistor means being responsive to said first bias potential and said second bias resistor means to limit the current to the final amplifier and the first and second driver amplifier to separate predetermined values by reducing the voltage applied thereto, said second bias resistance means of said third current limiting transistor means being responsive to said reduced voltage at the final amplifier to further reduce the voltage applied to the second driver amplifier whereby the drive signal to the final amplifier is reduced, said voltage regulator transistor means being responsive to a decrease in said voltage applied to the final amplifier below a predetermined value to establish a second bias potential at said control electrode, said first, second and third current limiting transistor means being responsive to said second bias potential to be biased to a cut off condition whereby the final amplifier and the first and second driver amplifiers are disconnected from the power supply, said bias circuit means being responsive to an increase in the impedance of the final amplifier to a predetermined value to develop a control voltage at said final amplifier, said voltage regulating transistor means being responsive to said control voltage to re-establish said first bias potential at said output electrode whereby said first, second and third current limiting transistor means are biased to conduction to reconnect the final amplifier and the first and second amplifiers to the power supply.

9. A transistor protection circuit for use in a carrier wave transmitter which includes a first portion for developing a carrier wave signal and a second portion for translating a carrier wave signal applied thereto, a carrier wave amplifier portion including a transistor final amplifier having a variable impedance coupling the first portion to the second portion, a power supply, said transistor protection circuit coupling the power supply to the final amplifier and including in combination, current limiting transistor means having base, emitter and collector electrodes, bias means coupled to said base electrode and to the power supply, first resistance means coupling said emitter electrode to the power supply, first circuit means coupling said collector electrode to the final amplifier, voltage regulator transistor means having a control electrode and an output electrode, regulating resistance means series connected with said voltage regulating transistor means between the power supply and a reference potential, second circuit means coupling the final amplifier to said control electrode and second resistance means coupling said control electrode to the power supply, third resistance means coupling the power supply to the final amplifier, and means coupling said bias means to said output electrode, said voltage regulator transistor means acting to control the flow of current through said regulating resistance means to establish a first bias potential at said output electrode, said current limiting transistor means being responsive to said first bias potential and said first resistance means to limit the current to the final amplifier to a predetermined value by reducing the voltage applied thereto, said voltage regulator transistor means being responsive to a decrease in said applied voltage below a predetermined value to establish a second bias potential at said control electrode, said current limiting transistor means being responsive to said second bias potential to be biased to a cut off condition whereby the final amplifier is disconnected from the power supply, said third resistance means being responsive to an increase in the impedance of the final amplifier to a predetermined value to develop a control voltage at said final amplifier, said voltage regulating transistor means being responsive to said control voltage to re-establish said first bias potential at said output electrode whereby said current limiting transistor means is biased to conduction to reconnect the final amplifier to the power supply.

10. A transistor protection circuit for use in a carrier wave transmitter which includes a first portion for developing a carrier wave signal and a second portion for translating a carrier wave signal applied thereto, a carrier wave amplifier portion coupling the first portion to the second portion and including a transistor final amplfier having a variable load impedance, a first driver amplifier coupled to the final amplifier and a second driver amplifier coupled to the first driver amplifier and a power supply, said transistor protection circuit coupling the power supply to the final amplifier and the first and second driver amplifiers and including in combination, first second and third current limiting transistor means each having base, emitter and collector electrodes, each of said first, second and third current limiting transistor means having separate bias means coupled to said base electrode and to the power supply and a separate first resistance means coupled between said emitter electrode and the power supply, each of said first, second and third current limiting transistor means having separate first circuit means coupling said collector electrode thereof to the final amplifier and the first and second driver amplifiers respectively, voltage regulator transistor means having a control electrode and an output electrode, regulating resistance means series connected with said voltage regulating transistor means between the power supply and a reference potential, second circuit means coupling the final amplifier to said control electrode and second resistance means coupling said control electrode to the power supply, third resistance means coupling the power supply to the final amplifier, and means coupling each of said separate bias means of said first, second and third current limiting means to said output electrode, said voltage regulator transistor means acting to control the flow of current through said regulating resistance means to establish a first bias potential at said output electrode, said first, second and third current limiting transistor means being responsive to said first bias potential and said first resistance means to limit the current to the final amplifier and the first and second driver amplifiers to a separate predetermined value by reducing the voltage applied thereto, said voltage regulator transistor means being responsive to a decrease in said voltage applied to the final amplifier below a predetermined value to establish a second bias potential at said control electrode, said first, second and third current limiting transistor means being responsive to said second bias potential to be biased to a cut off condition whereby the final amplifier is disconnected from the power supply, said third resistance means being responsive to an increase in the impedance of the final amplifier to a predetermined value to develop a control voltage at said final amplifier, said voltage regulating transistor means being responsive to said control voltage to re-establish said first bias potential at said output electrode whereby said first, second and third current limiting transistor means are biased to conduction to reconnect the final amplifier and the first and second driver amplifiers to the power supply.

11. A protection circuit for a transistor amplifier circuit having a variable impedance and including in combination a power supply, current limiting transistor means having base, emitter and collector electrodes, first bias reistance means coupled to said base electrode and to said power supply, second bias resistance means coupling said emitter electrode to said power supply, first circuit means coupling said collector electrode to the transistor amplifier, voltage regulator transistor means having a control electrode and an output electrode, regulating resistance means and zener diode means connected in parallel, said parallel connected regulating resistance means and zener diode means being series connected with said voltage regulating transistor means between said power supply and a reference potential, second circuit means coupling the transistor amplifier to said control electrode, third circuit means coupling said power supply to the transistor amplifier, and means coupling said first bias resistance means to said output electrode, said voltage regulator transistor means acting to control the flow of current through said parallel connected regulating resistance means and zener diode means to establish a first bias potential at said output electrode, said current limiting transistor means being responsive to said first bias potential and said second bias resistor means to limit the current to the transistor amplifier to a predetermined value by reducing the voltage applied thereto, said voltage regulator transistor means being responsive to a decrease in said applied voltage below a predetermined value to establish a second bias potential at said control electrode, said current limiting transistor means being responsive to said second bias potential to be biased to a cut off condition whereby the transistor amplifier is disconnetced from said power supply, said third circuit means being responsive to an increase in the impedance of the transistor amplifier to a predetermined value to develop a control voltage at said transistor amplifier, said voltage regulating transistor means being responsive to said control voltage to re-establish said first bias potential at said output electrode whereby asid current limiting transistor means is biased to conduction to reconnect the transistor amplifier to said power supply.

12. A transistor protection circuit for a transistor amplifier circuit having a variable impedance and including in combination, a power supply, current limiting transistor means having base, emitter and collector electrodes, bias means coupled to said base electrode and to said power supply, first resistance means coupling said emitter electrode to said power supply, first circuit means coupling said collector electrode to the transistor amplifier, voltage regulator transistor means having a control electrode and an output electrode, regulating resistance means series connected with said voltage regulating transistor means between said power supply and reference potention, second circuit means coupling the transistor amplifier to said control electrode and second resistance means coupling said control electrode to said power supply, third resistance means coupling said power supply to the transistor amplifier, and means coupling said bias means to said output electrode, said voltage regulator transistor means acting to control the flow of current through said regulating resistance means to establish a first bias potential at said output electrode, said current limiting transistor means being responsive to said first bias potential and said first resistance means to limit the current to the transistor amplifier to a predetermined value by reducing the voltage applied thereto, said voltage regulator transistor means being responsive to a decrease in said applied voltage below a predetermined value to establish a second bias potential at said control electrode, said current limiting transistor means being responsive to said second bias potential to be biased to a cut off condition whereby the transistor amplifier is disconnected from said power supply, said third resistance means being responsive to an increase in the impedance of the transistor amplifier to a predetermined value to develop a control voltage at said transistor amplifier, said voltage regulating transistor means being responsive to said control voltage to re-establish said first bias potential at said output electrode whereby said current limiting transistor means is biased to conduction to reconnect the transistor amplifier to said power supply.

13. A circuit for protecting a power supply and a variable impedance load coupled thereto from excessive current, including in combination, current limiting means including current sensing means coupling the power supply to the load for providing an operating current thereto, said operating current supplied to the load acting to increase in response to a reduction in the impedance of the load, said current limiting means being responsive to said operating current to regulate the magnitude of the power supply voltage supplied to the load whereby said operating current is limited to an amount less than a given value, voltage sensing means coupled to the load and to said current limiting means, said age sensing means being responsive to a reduction of said power supply voltage supplied to the load below a particular value to develop a control signal, said current limiting means being responsive to said control signal to disconnect the load from the power supply.

14. A protection circuit for a power supply and a variable impedance load coupled thereto from excessive current, including in combination, current limiting means including current sensing means coupling the power supply to the load for providing an operating current thereto, said operating current supplied to the load acting to increase in response to a reduction in the impedance of the load, said current limiting means being responsive to said operating current to regulate the magnitude of the power supply voltage supplied to the load, whereby said operating current is limited to an amount less than a given value, voltage sensing means coupled to the load and to said current limiting means, said voltage sensing means being responsive to a reduction of said power supply voltage supplied to the load below a particular value to develop a first control signal, said current limiting means being responsive to said first control signal to disconnect the load from the power supply, circuit means coupling the power supply to the load and being responsive to an increase in the load impedance above a predetermined value with said current limiting means disconnecting the load from the power supply to develop a second control signal, said circuit means being coupled to said voltage sensing means for applying said control signal thereto, said voltage sensing means being responsive to said second control signal to end said first control signal, whereby said current limiting means acts to supply current to the load from the power supply.

References Cited

UNITED STATES PATENTS

| | | | |
|---|---|---|---|
| 3,013,148 | 12/1961 | De Long et al. | 325—186 X |
| 3,202,924 | 8/1965 | Myers et al. | 330—22 |
| 3,218,542 | 11/1965 | Taylor | 307—88.5 X |
| 3,235,787 | 2/1966 | Gordon et al. | 307—88.5 X |

DAVID G. REDINBAUGH, *Primary Examiner.*

JOHN W. CALDWELL, *Examiner.*